(12) United States Patent
Kaule et al.

(10) Patent No.: US 7,880,152 B2
(45) Date of Patent: Feb. 1, 2011

(54) DEVICE AND METHOD FOR PRODUCING RESIST PROFILED ELEMENTS

(75) Inventors: Wittich Kaule, Emmering (DE); Rainer Plontke, Magdala (DE); Ines Stolberg, Jena (DE); Andreas Schubert, Niederrossla (DE); Marius Dichtl, Munich (DE)

(73) Assignees: Giesecke & Devrient GmbH, Munich (DE); Vistec Electron Beam GmbH, Jena (DE)

( * ) Notice: Subject to any disclaimer, the term of this patent is extended or adjusted under 35 U.S.C. 154(b) by 554 days.

(21) Appl. No.: 10/599,659

(22) PCT Filed: Mar. 30, 2005

(86) PCT No.: PCT/EP2005/051451

§ 371 (c)(1),
(2), (4) Date: Apr. 23, 2008

(87) PCT Pub. No.: WO2005/098544

PCT Pub. Date: Oct. 20, 2005

(65) Prior Publication Data

US 2008/0197295 A1 Aug. 21, 2008

(30) Foreign Application Priority Data

Apr. 8, 2004 (DE) .................. 10 2004 018 147

(51) Int. Cl.
*A61N 5/00* (2006.01)
*G21G 5/00* (2006.01)

(52) U.S. Cl. .................. 250/492.2; 250/310; 250/492.1; 250/492.3; 430/5; 430/22; 430/296; 430/397; 156/150; 156/272.2; 156/272.5; 359/569; 359/565; 359/566; 359/742; 359/743

(58) Field of Classification Search .................. 250/310, 250/492.2, 492.1, 492.3; 450/5, 22, 296, 450/397; 156/150, 272.2, 272.5; 359/569, 359/565, 566, 742, 743; 430/5, 22, 296, 430/397
See application file for complete search history.

(56) References Cited

U.S. PATENT DOCUMENTS 5,566,023 A * 10/1996 Kley .......................... 359/569

(Continued)

FOREIGN PATENT DOCUMENTS

DE 4113027.8 A1 10/1992

(Continued)

OTHER PUBLICATIONS

W. Brunger, E.B. Kley, B. Schnabel, I. Stolberg, M. Zierbock, R. Plontke Microelectric Engineering Microelectric Engineering 27, 1995, pp. 135-138 Elsevier Science B.V.

(Continued)

*Primary Examiner*—Jack I Berman
*Assistant Examiner*—Meenakshi S Sahu
(74) *Attorney, Agent, or Firm*—Houston Eliseeva, LLP (57) ABSTRACT

The invention relates to a device and a method for producing resist profiled elements. According to the invention, an electron beam lithography system is used to produce an electron beam, the axis of the beam being essentially perpendicular to a resist layer in which the resist profiled element is to be produced. The electron beam can be adjusted in terms of the electron surface dose in such a way that a non-orthogonal resist profiled element can be produced as a result of the irradiation by the electron beam.

10 Claims, 6 Drawing Sheets

U.S. PATENT DOCUMENTS 5,620,814 A * 4/1997 Kley .............................. 430/5

FOREIGN PATENT DOCUMENTS

EP          0648343         4/1995

OTHER PUBLICATIONS

Kley, E. et al. E-Beam lithography; a suitable technology for fabrication of high-accuracy . . . Proceedings of the SPIE, Oct. 23, 1995, p. 71-80, v.2640, SPIE, Bellingham, VA, US.

Schnabel, B. et al. Fabrication and application of subwavelength gratings. Proceedings of the SPIE, Feb. 10, 1997, p. 233-41, v.3008, SPIE, Bellingham, VA, US.

Heidenrich, R. et al. Electron scattering and line profiles in negative electron resists. Journal of Vacuum Science and Technology, Nov. 1976, p. 1284-88, v.12, n.6, AVS, NY, US.

Lin, L. Cross-section profiles of single-scan negative electron-resist lines. Journal of Vacuum Science and Technology, Nov. 1976, p. 1289-93, v.12, n.6, AVS, NY, US.

Jagdhold, U. et al. 60nm copper lines produced by a lift-off technique with 5keV electrons . . . Proceedings of the SPIE, 1997, p. 757-64, v.3049, SPIE, Bellingham, VA, US.

Ham, Y. et al. Application of a new empirical model to the electron beam lithography . . . Japanese Journal of Applied Physics, Dec. 1998, p. 6761-66, v.37, n.12B, JSAP, Tokyo, JP.

Wittig, L. et al. Intermittence effect in electron beam writing. Microelectronic Engineering, Sep. 2001, p. 321-6, v.57-58, Elsevier Publishers, Amsterdam, NL.

* cited by examiner

State of the Art

State of the Art

DEVICE AND METHOD FOR PRODUCING RESIST PROFILED ELEMENTS

The invention relates to a device for producing resist profiled elements. The invention further relates to a method for producing resist profiled elements. To this is added a use of the device for producing resist profiled elements and a use of the method for producing resist profiled elements.

To date, resist layers have been produced in the semiconductor industry with the help of electron-beam lithography. These structured resist layers serve as auxiliary masks for structuring the substrate lying below them. Accordingly, steep edges (perpendicular to the substrate surface) are required for the resist profiled element.

Published German patent application 41 13 027.8 discloses a method and an device with which grating scales of any length may be produced, having a grating constant in the μm range. First, a master scale is imaged step-by-step continuously on a flexible metal strip coated with a photoresist. A sensor that is coupled to the imaging device detects the structures in the exposed photoresist. Alternately switched holding devices for the flexible metal strip on the imaging device and the table of the imaging device successively feed further segments of the metal strip into the imaging area via a relative displacement between the imaging device and the table. Control signals from the sensor guarantee in-phase coupling of the images of the master grating.

European patent 0 648 343 discloses a Fresnel lens and a method for its production. The work is done with an electron beam, the orthogonal beam cross-section of which is changeable. Because changes are implemented quickly, a stepped Fresnel lens may be produced in this manner. Electron beam doses, which correspond to those of cylindrical lenses, are exposed one on top of the other. Any form of lens described can be produced in this manner. The finer the structures, the more problematic it becomes to produce smooth flanks on the structures with multiple exposure.

The object of the invention is to create a device with which different resist profiled elements may be produced, and whereby the user is provided the means for modeling the resist profiled elements.

This object is solved by a device for producing resist profiled elements comprising: an electron beam lithography system that produces an electron beam, the beam axis of which lies largely perpendicular to a resist layer in which the resist profiled element is produced, wherein the electron beam is adjustable with regard to the electron surface dose such that a resist profiled element that exhibits a non-orthogonal resist profile is produced as a result of irradiation with the electron beam.

It is advantageous for the resist layer to comprise a negative resist. The resist profiled element comprises a grating structure that comprises a parallel array of depressions and elevations. The primary energy of the electron beam of the system for electron beam lithography is adjustable, whereby the lower limit of the primary energy is 1 KeV and the upper limit of the primary energy is 20 KeV. The thickness of the resist layer is between 100 nm and 500 nm. The electron surface dose depends on the primary energy of the electron beam, electron scattering in the resist layer, the probe size, and the electron dose.

A further object of the invention is to create a method with which the different resist profiled elements may be produced, and whereby the user is provided the means for modeling or predetermining the resist profiled elements.

This object is solved by a method for producing resist profiled elements with an electron beam lithography system, which produces the electron beam with a primary energy, the beam axis of which is largely perpendicular to a resist layer in which the resist profile is produced, comprises the steps of:
 determining of parameters that influence an electron surface dose, and
 adjusting the electron beam with regard to the electron surface dose such that a resist profiled element that exhibits a non-orthogonal resist profile is produced as a result of irradiation of the resist layer by the electron beam.

It is advantageous if a device for producing resist profiled elements comprises a system for electron beam lithography that produces an electron beam. For this purpose, the beam axis is largely perpendicular to the resist layer in which the resist profiled elements is to be produced. The electron beam is adjustable with regard to electron surface dose such that a resist profiled element is produced as a result of exposure by the electron beam, which exhibits a non-orthogonal resist profile.

The resist layer may be applied to a substrate. It is also conceivable that the resist layer can be used without a substrate, and that the resist profiled elements are produced in an upper region of the resist layer.

The electron surface dose is defined by parameters such as the substrate type, resist type, resist thickness, design rule, and primary energy of the electron beam, and in that the electron beam is adjusted according to these parameters to produce the desired resist profiled element. The resist profiled element comprises a grating structure that consists of a parallel array of depressions and elevations. The amplitude of the primary energy of the electron beam establishes a diameter of a scattering cone in the resist layer around the site of incidence of the electron beam, whereby the diameter of the scattering cone is inversely proportional to the primary energy of the electron beam. Exploitation of the effect of the secondary electrons in combination with the negative resist enables the production of non-orthogonal resist profiled elements.

The probe size is quasi-continuously adjustable. The profile in the resist layer is scribable with a single probe size, whereby the probe size is smaller than the smallest possible structure size.

Further advantageous developments of the invention may be deduced from the subclaims.

The object of the invention is schematically represented in the diagram and is described below based on the figures. They show.

Figure 1:
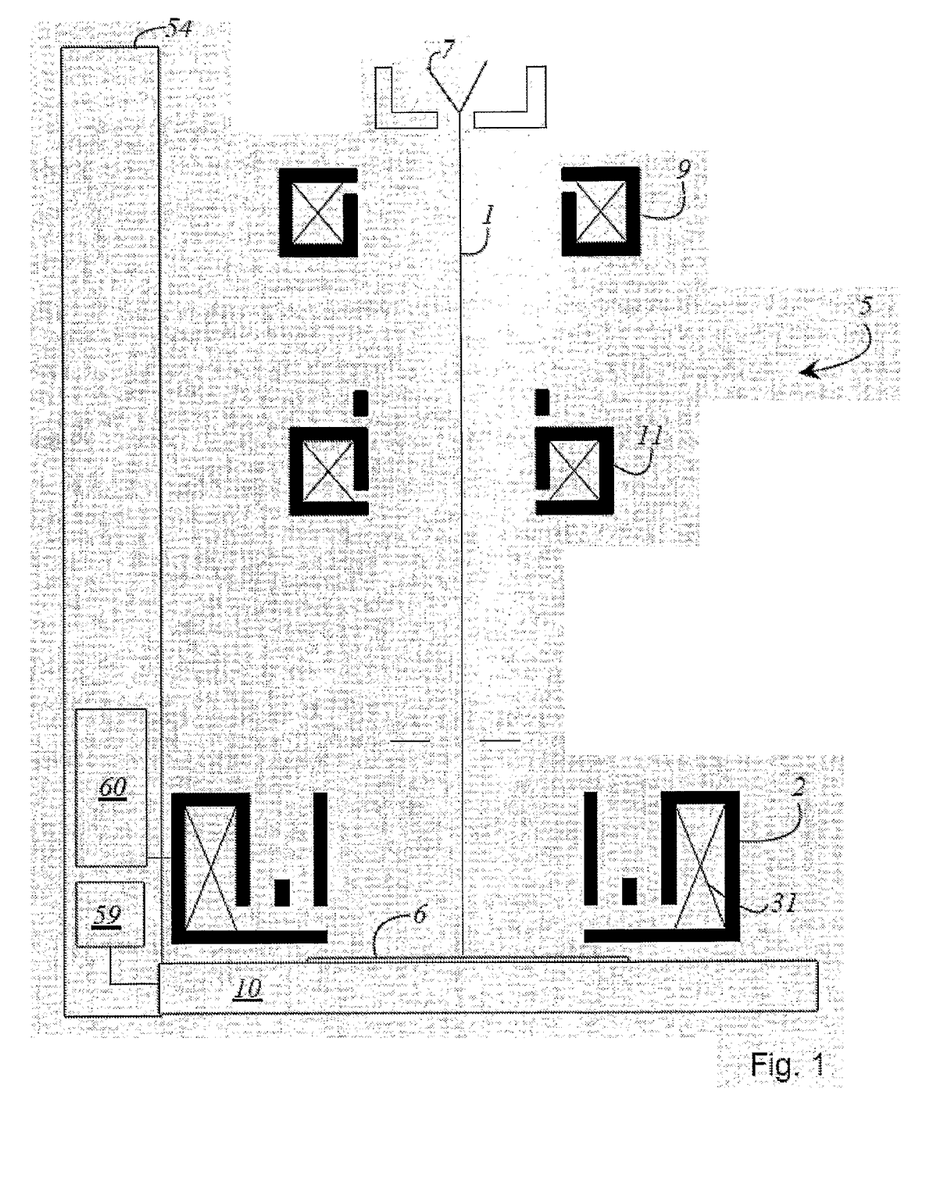
FIG. 1 a schematic representation of the construction of an entire electron beam lithography system.

FIG. 1 illustrates the structure of an electron beam column 5 in which the electron beam 1 is produced by an electron cannon 7 that forms a beam source, whereby it passes through a condenser lens 9 to an objective lens 2 and consequently to a resist layer 6. Generally, the resist layer 6 is applied to a substrate 6a (see FIG. 4 to FIG. 6). Although the description below is limited to electron beams, it will be clear to a person skilled in the art that any other particle beams with charged particles may be used here. The arrangement comprises a control system 54. It is equally possible for a resist profiled element to be produced in the resist layer without a substrate.

In addition, the electron beam 1 is scanned or moved over the resist layer 6 to process (electron-beam lithography) various parts the resist layer 6. For limited scanning areas, scanning can be achieved using a scanning device 11 that is controlled by a scanning control device 60. For larger movements, table control 59 ensures that the table 10, and therewith the resist layer 6, are displaced horizontally. The control system 54 is controlled by a computer (not represented).

The entire device for producing resist profiled elements comprises a system consisting of the already described electron beam column and the resist layer 6. By matching the primary energy of the electron beam and the type of resist layer 6 used, one obtains an electron density distribution at a specific distance from the irradiation site. The electron beam 1, and consequently also the electron beam column 3, are adjustable with regard to the electron surface dose such that as a result of irradiation by the electron beam a resist profile 12 is producible that exhibits a non-orthogonal resist profile. As a result of the energy input of the electron beam 1 during electron beam exposure, the solubility of the exposed resist is changed in a solvent. The electron beam 1 that strikes the resist layer is scattered, and the scattering is dependent on the primary energy of the electron beam 1.

Figure 2A:
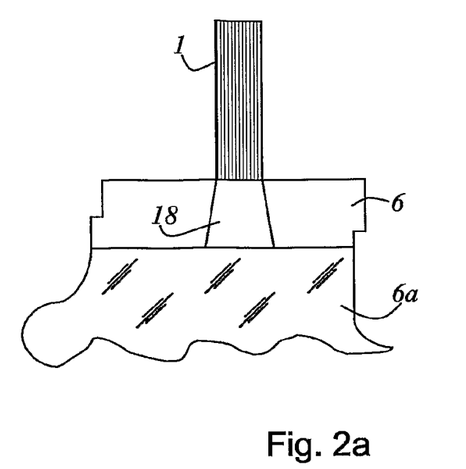
FIG. 2a a schematic representation of the scattering of the electron beam with high primary energy in the resist layer.

FIG. 2a shows a schematic representation of scattering in the resist layer 6 of an electron beam with high primary energy. The higher the primary energy of the electron beam 1, the less the scattering of the electron beam 1 in the resist layer 6. The electron beam 1 strikes the resist layer 6 and has a probe size 1a of a certain diameter 16 on the surface 15 of the resist (see FIG. 2b).

A scattering cone 18 is produced in the resist layer 6 by the scattering, such that there is a spatially expanded influence on the resist. The resist layer 6 comprises a negative resist. This means that the higher the electron energy acting upon the resist, the more the solubility of the resist is decreased by the solvent.

Figure 2B:
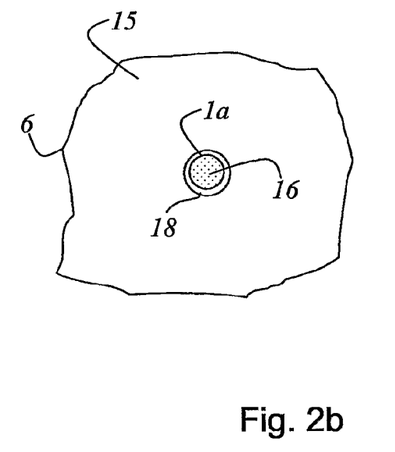
FIG. 2b a top view of the surface of the resist layer and the projection of the electron beam from FIG. 2a on the resist layer.
Figure 2C:
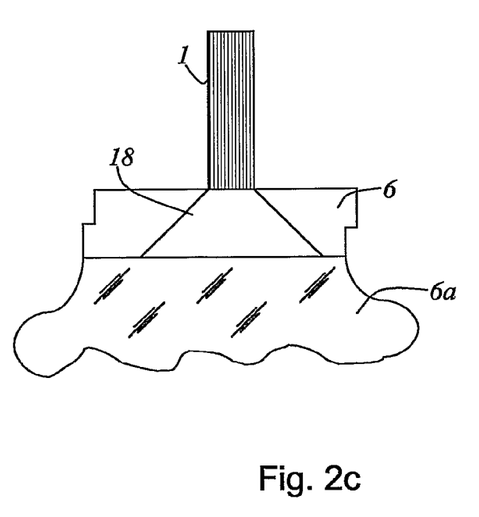
FIG. 2c a schematic representation of the scattering of an electron beam with low primary energy in the resist layer.
Figure 2D:
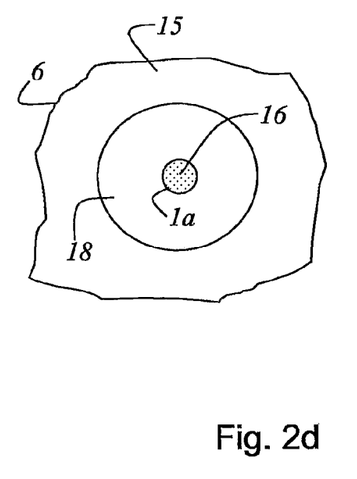
FIG. 2d a top view of the surface of the resist layer and the projection of the electron beam from FIG. 2c on the resist layer.

FIG. 2c shows a schematic representation of the scattering of an electron beam 1 with low primary energy in the resist layer 6. As a result of the low primary energy of the electron beam 1, the scattering cone 18 possesses a larger diameter than that represented in FIG. 2a. As a result of the scattering of electrons in the resist layer 6, the electron beam expands more extensively in comparison to the diameter of the electron beam 1 directly on the surface 15 of the resist layer 6 (see FIG. 2d). The probe size 1a of the electron beam 1 is represented as a circle in FIG. 2b and FIG. 2d. The representation of the probe size 1a as a circle should not be interpreted as a limitation. Other projections of the electron beam 1 on the surface 15 of the resist layer 6 are possible, and the representation of a circle as in FIG. 2b and FIG. 2c should also not be interpreted as a limitation.

As represented in FIG. 2a and FIG. 2b, as a result of the scattering of the electron beam 1, areas of the resist layer are influenced by electrons that are not directly struck by the electron beam. This generally negative circumstance is known as the proximity effect. This circumstance is exploited by the invention. As already mentioned above, the size and form of the scattering cone 18 are not limited solely to a spherical form. The size and form of the scattering cone 18 within which the electrons trigger reactions in the resist layer also depend, among other things, on the primary energy of the electron beam 1. The diameter of the scattering cone 18 becomes larger as the energy of the electron beam decreases; by contrast, the number of electrons that are backscattered from the resist decreases as a result of the lower penetration depth. Electron density distribution can be adjusted within certain limits by selecting the primary energy of the electron beam 1.

The probe size 1a has proved to be a further parameter for modeling resist profiled elements. In general, if a small probe size 1a is enlarged with the help of device control, this acts in the resist layer 6 like a physical integration of a multiplicity of fine adjacent probes, and therefore like a superposition of the individual scattering cones 18. Particularly in the production of diffraction gratings, this means that similar profiles can be produced for a large range of grating constants.

The electron dose is a third parameter. The electron dose can be adjusted with the help of the selected current density of the electron beam and the exposure time. In the final analysis, this is where the size of the scattering cone 18 is determined, within which take place effective reactions with the resist that is sensitive to the electrons of the electron beam 1.

The electron beam 1 is adjusted with regard to the electron surface dose such that a resist profiled element that exhibits a non-orthogonal resist profile is producible as a result of exposure by an electron beam. For this purpose, an energy density profile is produced in the resist layer 6 with the above-mentioned parameters. What is decisive is that one use a resist that converts this electron-density profile into a suitable solubility profile in the resist layer 6.

Figure 3:
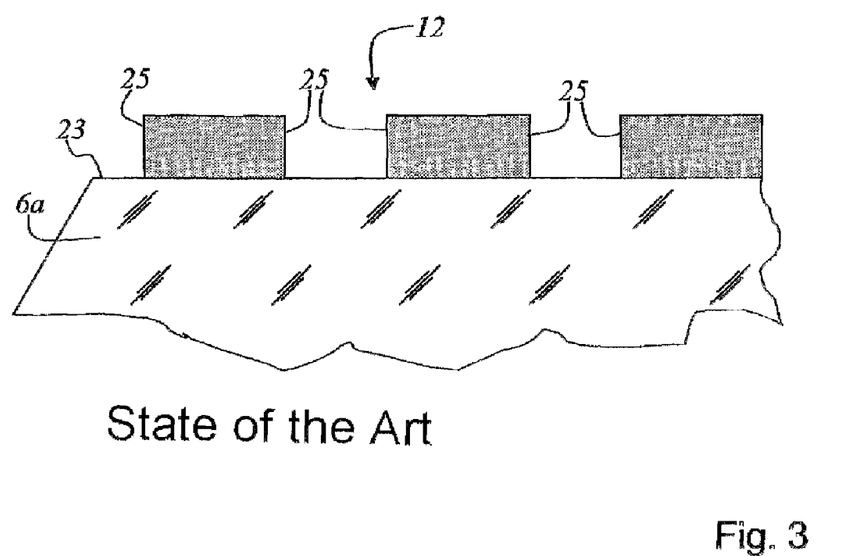
FIG. 3 an orthogonal profile according to the state-of-the-art produced by irradiation with an electron beam.

FIG. 3 shows a resist profiled element 12 produced by an electron beam in a resist layer 6. These resist profiled elements produced according to the state-of-the-art are generally used as auxiliary masks in the semiconductor industry to structure a substrate lying thereunder. Accordingly, steep (perpendicular to the substrate surface) edges 25 are required, if possible, and therefore also produced. The edges 25 are perpendicular to the substrate surface 23.

Figure 4:
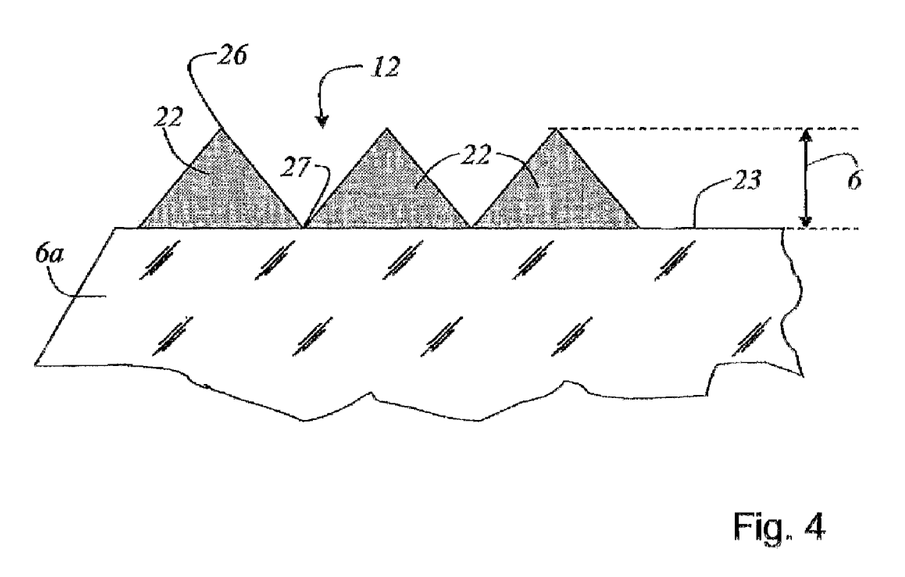
FIG. 4. a view of a triangular profiled element that is producible by the present invention.
Figure 5:
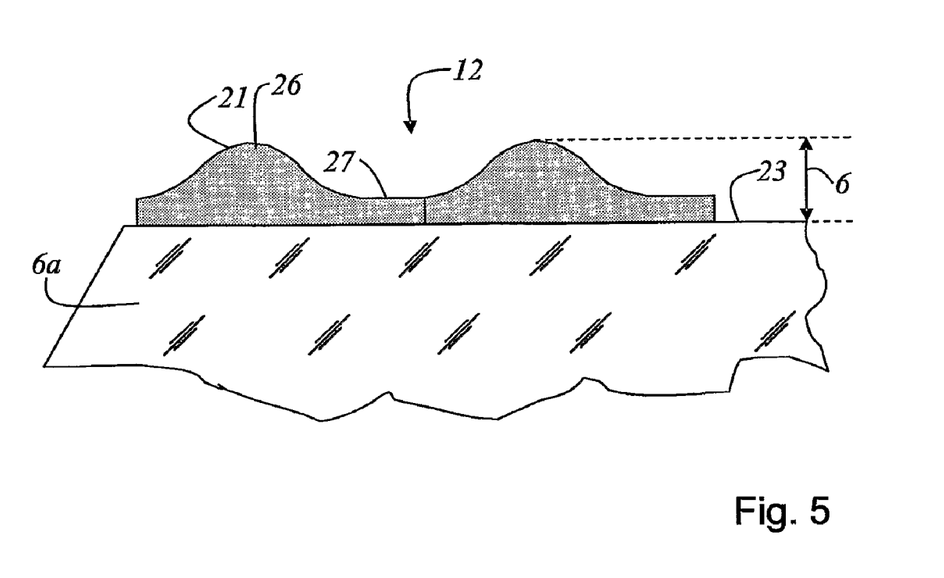
FIG. 5 a view of a sinusoidal profiled element that is producible by the present invention.
Figure 6:
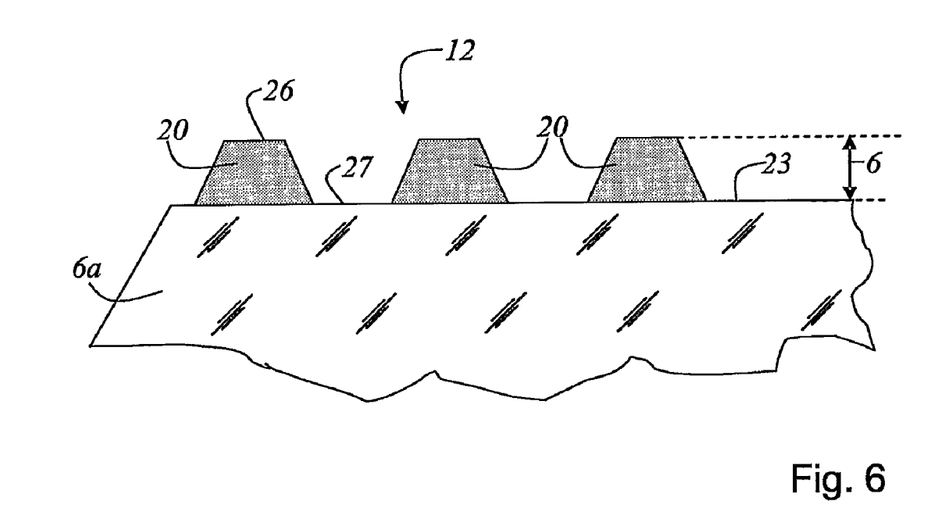
FIG. 6 a view of a trapezoidal profiled element that is producible by the present invention.

FIG. 4 to FIG. 6 disclose resist profiled elements 12 that exhibit non-orthogonal resist profiles 12. FIG. 4 shows a view of a triangular profile 22 that is producible with the present invention. The side edges of the triangular profile 22 are not perpendicular to the substrate surface 23. It is therefore important to select a resist that converts the selected electron density profile into a suitable solubility profile so that the resist profiled elements 12 shown in FIG. 4 to FIG. 6 may be produced. The resist of the resist layer 6 comprises a negative resist and possesses a linear gradation, if possible, so that the electron-density distribution in the resist layer 6 may be transformed into a solubility distribution of the resist layer 6 with gradations that are as fine as possible. Finally, the resist profile 12 consists of a great structure that comprises a parallel array of depressions 27 and elevations 26.

FIG. 5 shows a sinusoidal profile 21 that is producible with the present invention.

FIG. 6 shows a view of a trapezoidal profile 20 that is producible with the present invention.

As is evident from FIG. 4 to FIG. 6, a structural element can typically be scribed in a single exposure step. The resist profiled element 6 comprises a grating structure 24 that consists of a parallel array of depressions 27 and elevations 26. One exposure step therefore always scribes one elevation 26. As aforementioned, the elevation is visible only after the resist layer 6 is treated with a solvent. A multiplicity of elevations 26 that are arranged parallel to each other and separated from each other comprise a grating structure 24. One element of the grating structure 24 is, for example, identified as a grating bar 35, which is producible according to the present invention in a single exposure step 30.

Figure 7:
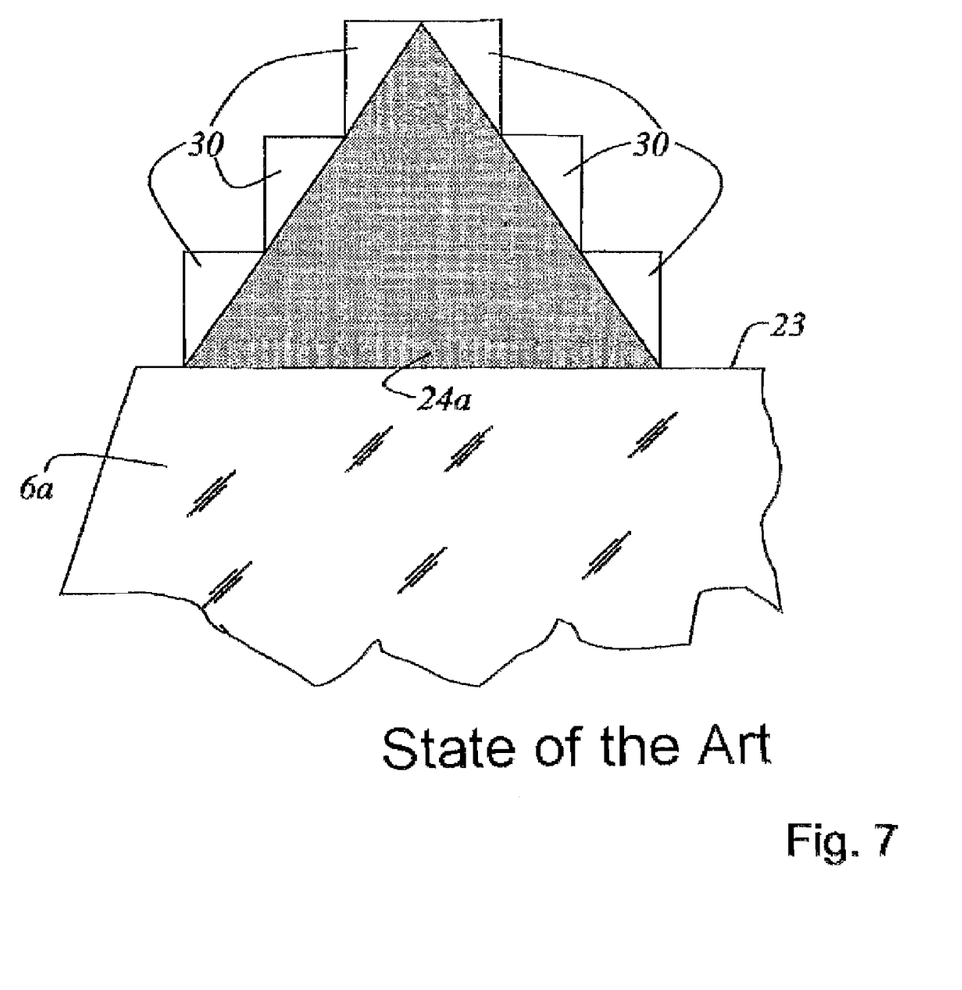
FIG. 7 a representation of the production of an element of the grating structure with n successive exposure steps for producing non-orthogonal resist structures according to the state-of-the-art.

FIG. 7 shows a representation of the production of an element 24a of the grating structure 24 with n successively undertaken exposure steps 30 to produce non-orthogonal resist structures according to the state-of-the-art. To produce a grating structure consisting of N elements 24a, N x n exposure steps are therefore necessary. The individual exposure steps 30 are chronologically exposed one after the other, and it is obvious that positional precision of the individual steps in relation to each other must be observed. To this end, t size and effect of the scattering cone 18 in the resist layer must be taken into consideration so that a certain registration overlap is observed. If the overlap precision is not observed, this may lead to a deterioration in the structural fidelity or uniformity of analogous structures. To this is added that longer processing times must be used according to this method to produce an element 24a, and therefore also to produce the entire structure.

As previously described, an electron-beam lithography device 1 is needed to produce non-orthogonal structures in the resist layer 6. The electron-beam lithography device makes it possible to work with different energies of the primary electrons. In the process, such energies of the primary electrons, in particular, must be used in which the penetration depth of the primary electrons into organic resists is of the order of magnitude of typically used resist thicknesses (100 nm . . . 500 nm). The lower energy limit of the primary electrons should be at about 1 keV; an upper energy limit of the primary electrons should be adequate at 20 keV. The primary energy must be continuously changeable or at least in small steps (quasi-continuously).

Figure 8:
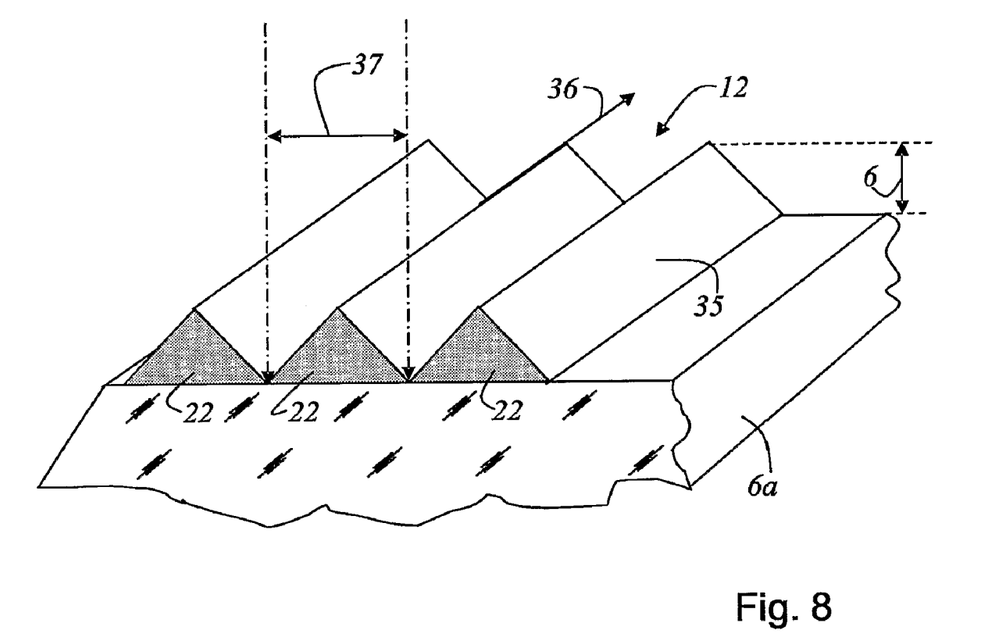
FIG. 8 a schematic representation of the production of a resist profiled element with a two dimensional design according to the invention.

FIG. 8 shows a schematic representation of the production of a resist profiled element 12 having a two-dimensional design, according to the invention. For simplicity of representation, a triangular profiled 22 was selected. This should not, however, be interpreted as a limitation. The two-dimensional design of the resist profiled element 12 comprises a multiplicity of structural elements, of which each element is identified as a grating bar 35. As a result of the irradiation of the resist layer 6 by the electron beam, one obtains a laminar resist profile 12 after development of the resist layer 6. In order to produce the resist profiled element 12, the electron beam passes over the resist layer 6 in several steps. The arrow 36 defines a step by which a grating bar 35 is produced. The width of the grating bar 35 is identified by the double arrow 37.

In use, electron-beam lithography devices that work either according to the point beam (Gaussian beam) principle or the form beam (variable-shaped beam) principle may be used. Two things are decisive. The probe size 1a must be quasi-continuously changeable over a certain range. The minimum probe size 1a must be smaller than or small in comparison to the minimum of the structural elements to be produced. Nanolithographical devices that work according to the point beam principle (probe size less than or equal to 5 nm) are ideal for this application, but are not absolutely necessary.

The electron-beam lithography device 1 must be capable of fine dose control in the exposure regime being applied. This condition is generally met and occurs by means of exposure time (dwell time, shot rate) or the exposure speed while the substrate is being displaced.

The resist being used must be a negative resist, i.e., the parts of the resist irradiated with electrons must, in comparison with the developer or solvent (at a particular temperature, particular concentration, or particular reaction time) have lower solubility than the un-irradiated resist. As a further characteristic, reference is made to the contrast curve of the resist. The contrast curve is obtained, under otherwise constant conditions like (energy of the primary electrons, development process, initial thickness $d_0$ of the resist layer 6), one obtains a graphical representation of the residual thickness of the resist layer 6 after development as a function of the electron surface dose D used. To generalize, it is useful to switch over to a standard contrast curve in which the residual thickness of the resist layer 6 is related to the initial thickness $d_0$ of the resist layer 6, and the electron dose used related to the maximum dose $D_{max}$, after which there is no further erosion of the resist layer 6. The resist has a sufficiently soft gradation for the method so long as the steepness S of same does not exceed the value of 1.5 according to the curve represented in equation (1).

$$S = \left(\frac{\Delta d}{d_0}\right) / \left(\frac{\Delta D}{D_{max}}\right) \qquad \text{Equation 1}$$

Resists, including a suitable development method that meets this condition, exist and are commercially available. The standard electron surface dose is the quotient of the electron surface dose used and the maximum electron surface dose. The maximum electron surface dose is that electron surface dose at which no erosion of the resist occurs during the development process.

The following is done to determine the contrast curve for the selected resist system (substrate, resist, thickness of the resist layer 6, development rule, energy of the primary electrons). First, surfaces (of, e.g., 50 μm×100 μm) are exposed with different doses. After development, e.g., with a stylus-type instrument, the residual thickness of the resist layer 6 is measured and the contrast curve that will be needed to proceed further determined therefrom. The method is repeated for a multiplicity of potential electron energies.

This applies equally to the later defined adjustment of the system that determines the scattering cone 18 and size thereof. The previously selected system is used, comprising substrate, resist, thickness of the resist layer 6, development rule, and energy of the primary electrons. Single lines are now scribed in the resist layer 6, whereby the smallest possible probe size is set on the electron-beam lithography device. At least the maximum dose $D_{max}$ is used for the purpose. As will be clear from the following, it is, however, useful to use higher values as well, and to group individual lines into groups of lines with different grating constants. After processing the substrate, same is refracted perpendicular to the lines, and the cross-section or the line profile can be determined with the help of a scanning electron microscope (not shown). One thus obtains a residual resist thickness distribution dependent on the site of incidence of the electron beam. This residual thickness distribution can be converted with the help of the contrast curve into an electron dose distribution that is effective therein. This electron dose distribution is the scattering cone 18. Overall, this yields the effective electron density for the system under consideration, dependent on the irradiation site or site of incidence of the electrons, as the case may be. Because single lines are used, this may be represented by a one-dimensional function such as, for example, in equation 2.

$$D=D_0 \times f(x) \qquad \text{Equation 2}$$

This basic function enables one, simply by superposition, to calculate the result that is yielded when the gratings are exposed. In other words, this means that the exposure of an adjacent grating bar occurs in the range at which the dose of the previously or subsequently exposed grating bar has a finite size. The gratings or wider lines, as the case may be, that are recommended by the above rule essentially serve to check the theoretical predictions experimentally. In other words, they are not absolutely necessary, although they increase the precision of the determination of D=D(x), and therefore also the significance of the prediction. For a real grating structure, one therefore obtains the electron density distribution of a grating bar by summation, as shown in equation 3.

$$D_{result}=D_B \times [f_e(x)+f_e(x-g)+f_e(x+g)] \qquad \text{Equation 3}$$

Equation 3 applies when the grating bars are scribed with the smallest possible probe. A profile of the individual grating bar that is scribed with a probe having a width B larger than the smallest possible width b, such as for example B=(2n+1)×b is then obtained according to equation 4:

$$D_B = \left(\frac{D_0}{(2n+1)}\right) \times \sum_{i=1}^{i=n} [f_e(x) + f_e(x - i \times b) + f_e(x + i \times b)] \qquad \text{Equation 4}$$

If one uses the value $D_B$ as calculated in equation 4 instead of $D_0$ in equation 3, one can also calculate grating arrangements in which the bars are not exposed with the smallest possible probe.

The electron density is then converted into a layer thickness distribution with the help of the contrast curve. By varying the parameters ($D_0$, g, b) and selecting the energy $f_e(x)$, the particular variant can then be found that best corresponds to the desired profile.

Three examples of the use of non-orthogonal resist profile elements are listed below:

EXAMPLE 1

CD—DVD—Super DVD

In these storage mediums, information is contained in so-called "pits" and "lands." Pits and lands are arranged along the track on an alternating basis. They differ in their length. Pits are raised above their surroundings. When read, the storage medium is scanned by a focused laser beam. The diameter of the laser spot is typically about three times greater than the pits are wide. This serves to center the spots while scanning the medium.

Because lasers are also used with CDs and DVDs to write the master, this means that when using a minimal spot diameter, the mediums can only be scribed three times as coarsely as is needed to read them afterwards. It is therefore obvious that one use the electron beam to produce the master in order to achieve the limit of what is optically readable. As it happens, however the signal does not originate at the raised surfaces of the pits and lands, but rather at their flanks. And the flank angle, in particular, determines amplitude and signal quality, as the case may be, and therefore also determines the reliability of the readout or of the readout speed. In other words, the desired trapezoidal form of the cross-section of the pits can be optimally set with the method described by us.

EXAMPLE 2

Scales for Length-Measuring Machines

In positioning systems with the highest level of precision, two methods for determining coordinates are used today, first a laser path measurement system, and then the optical scanning of precision gradations. The method described by us is helpful for the latter. When measuring, the displaced scale is irradiated by a laser, and the diffracted light is registered by sensors. The maxima and minima of the diffracted light thus registered are counted and, converted with the grating constant, yield the distance by which the system must be displaced with the firmly anchored scale. If the profile (cross-section of the grating) is then selected in the appropriate manner, the entire diffraction intensity can be directed in a single diffraction order, i.e., one achieves high signal intensity. This, in turn, means faster measuring or positioning, as the case may be, and more reliable measuring or positioning. Sinus gratings have this property, and this profile modeling can be achieved with the method described by us.

EXAMPLE 3

Security Holograms

Currency, credit cards, passports, etc., are increasingly being furnished with non-copyable security features. These include holograms, which are visible to the bare eye and change their color and their appearance depending on the angle of visualization. Diffractive grating structures are a physical element of such holograms. And here, too, what was said under example 2 applies: if the profile of these security features is suitable, e.g., sinusoidal, these security features become very optically luminous, pronounced, and distinctive. Further features that are based on the grating structure also result for machine evaluation, but are disclosed only with a certain hesitancy for understandable reasons. If the masters for those elements are produced with the help of an electron beam, our method is available to implement in practice the theoretically specified characteristics.

The invention claimed is:

1. A method for producing resist profiled elements with an electron beam lithography system, which produces the electron beam with a primary energy, the beam axis of which is largely perpendicular to a resist layer in which the resist profile is produced, comprising the steps of:
   providing the resist layer in the form of a negative resist on a substrate;
   exposing surfaces of a selected resist system of substrate, resist and thickness of the resist layer with different doses and determining a contrast curve after development the measured residual thickness of the resist layer;
   determining for a later defined adjustment of the electron beam lithography system a scattering cone and a size thereof in relation to the resist system, wherein a plurality of single lines are scribed in the resist layer with a probe size as small as possible and thereby obtaining a residual resist thickness distribution which is dependent on the site of incidence of the electron beam and being converted with the help of the contrast curve into an electron dose distribution that is the scattering cone;
   determining from the contrast curve the electron dose distribution of the scattering cone the resulting resist thickness distribution, which depends from several parameters;
   adjusting the electron beam with regard to parameters including the electron surface dose, width of the generated resist profile, thickness of the resist layer, and/or the primary energy of the electron beam, such that a non-orthogonal resist profile is produced and the probe size is the smallest possible structure size; and adjusting the probe size is quasi-continuously, whereby the primary energy of the electron beam is continuously changeable, a lower energy limit of the primary electrons is 1 keV, and an upper energy limit of the primary electrons is 20 keV.

2. The method according to claim 1, wherein the electron surface dose is defined by parameters such as the type of substrate, type of resist, resist thickness, development rule, and primary energy of the electron beam, and wherein the electron beam is adjusted according to these parameters.

3. The method according to claim 1, wherein the resist profile comprises a grating structure that consists of an array of depressions and elevations.

4. The method according to claim 1, wherein a gradation curve of the used resist is taken.

5. The method according to claim 1, wherein with the primary energy of the electron beam, the development process, and the resist thickness held constant, a gradation of the resist is applied as a function of a standard resist thickness in relation to the standard electron surface dose used is applied before electron irradiation.

6. The method according to claim 5, wherein the gradation $$S = \left(\frac{\Delta d}{d_0}\right) \Big/ \left(\frac{\Delta D}{D_{max}}\right)$$

does not exceed the value of 1.5.

7. The method according to claim 6, wherein surfaces in the resist layer are exposed with a variable electron dose, and wherein the appropriate electron dose for the pertaining and residual resist thickness is determined after the development process.

8. The method according to claim 1, wherein one element of the profile of the grating structure consisting of depressions and elevations is determined by the electron surface dose $$D_B = \left(\frac{D_0}{(2n+1)}\right) \times \sum_{i=1}^{i=n} [f_e(x) + f_e(x - i \times b) + f_e(x + i \times b)]$$

to be used.

9. The method according to claim 1, wherein a diameter of a scattering cone is produced by the amplitude of the primary energy of the electron beam in the resist layer around the site of incidence of the electron beam, whereby the diameter of the scattering cone is inversely proportional to the primary energy of the electron beam.

10. The method according to claim 1, wherein the electron surface dose is defined by the parameters such as type of substrate, type of resist, resist thickness, development rule, and primary energy of the electron beam.

* * * * *